US012613431B2

(12) United States Patent
Park et al.

(10) Patent No.: US 12,613,431 B2
(45) Date of Patent: Apr. 28, 2026

(54) STEREOPSIS IMAGE DISPLAY APPARATUS

(71) Applicant: LG Display Co., Ltd., Seoul (KR)

(72) Inventors: Myung-Soo Park, Paju-si (KR);
Youngmin Kim, Paju-si (KR)

(73) Assignee: LG Display Co., Ltd., Seoul (KR)

( * ) Notice: Subject to any disclaimer, the term of this
patent is extended or adjusted under 35
U.S.C. 154(b) by 321 days.

(21) Appl. No.: 18/461,432

(22) Filed: Sep. 5, 2023

(65) Prior Publication Data

US 2024/0264462 A1 Aug. 8, 2024

(30) Foreign Application Priority Data

Feb. 2, 2023 (KR) ........................ 10-2023-0014256

(51) Int. Cl.
*G02B 30/27* (2020.01)
*H10K 59/122* (2023.01)
*H10K 59/80* (2023.01)

(52) U.S. Cl.
CPC ........... *G02B 30/27* (2020.01); *H10K 59/122*
(2023.02); *H10K 59/879* (2023.02)

(58) Field of Classification Search
CPC .................... G02B 30/27; G02B 30/29; G02B
2003/0093; H10K 59/122; H10K 59/879;
H10K 59/121; H10K 59/131; H04N
13/305
See application file for complete search history.

(56) References Cited

U.S. PATENT DOCUMENTS

| | | | |
|---|---|---|---|
| 9,690,109 B2 | 6/2017 | Jin et al. | |
| 2015/0185489 A1* | 7/2015 | Jin ......................... | G02B 30/27 |
| | | | 359/463 |
| 2022/0020962 A1 | 1/2022 | Kim et al. | |
| 2022/0077431 A1* | 3/2022 | Lee ..................... | H10K 59/8792 |
| 2022/0350207 A1* | 11/2022 | Zhou ................. | G02F 1/133512 |
| 2023/0283760 A1* | 9/2023 | Park ........................ | G02B 30/29 |

FOREIGN PATENT DOCUMENTS

| | | |
|---|---|---|
| KR | 20150080187 A | 7/2015 |
| KR | 20220008471 A | 1/2022 |

* cited by examiner

*Primary Examiner* — Charles S Chang
(74) *Attorney, Agent, or Firm* — Seed Intellectual
Property Law Group LLP

(57) ABSTRACT

A stereopsis image display apparatus includes a substrate
including a display area and a non-display area, a plurality
of pixels provided in the display area of the substrate, the
plurality of pixels each including a plurality of subpixels,
and a plurality of lenses provided on the plurality of pixels,
wherein each of the plurality of subpixels includes a two-
dimensional (2D) subpixel and a three-dimensional (3D)
subpixel, and each of the plurality of lenses is provided to
overlap the 3D subpixel.

19 Claims, 9 Drawing Sheets

EA1: EA11, EA12     EA2: EA21, EA22

EA3: EA31, EA32

STEREOPSIS IMAGE DISPLAY APPARATUS

CROSS-REFERENCE TO RELATED APPLICATIONS

This application claims the benefit of the Korean Patent Application No. 10-2023-0014256 filed on Feb. 2, 2023, which is hereby incorporated by reference as if fully set forth herein.

BACKGROUND

Technical Field

The present disclosure relates to a display apparatus, and more particularly, to a stereopsis image display apparatus.

Description of the Related Art

Recently, as the demands of users for vivid and realistic images increase, stereopsis image display apparatuses for displaying a three-dimensional (3D) image as well as a two-dimensional (2D) image have been developed.

Stereopsis image display apparatuses of the related art may be categorized into a stereoscopic 3D display technique and an autostereoscopic 3D display technique. The stereoscopic 3D display technique are categorized into a polarizing-type stereoscopic 3D display technique, which changes a polarization of a binocular parallax image to display an image in a direct-view display device or projector and implements a stereopsis image by using polarizing-type glasses, and a shutter stereoscopic 3D display technique which temporally divides and displays a binocular parallax image and implements a stereopsis image by using shutter glasses. The autostereoscopic 3D display technique implements a stereopsis image by using a 3D optical cell such as a lenticular lens sheet or a parallax barrier generally.

The 3D optical cell may be disposed on a front surface or a rear surface of a display panel. The 3D optical cell may be manufactured through a separate process independently of a display panel, and due to, the cost may increase and a Moire pattern caused by an align structure with a display panel may occur.

BRIEF SUMMARY

Accordingly, the present disclosure is directed to providing a stereopsis image display apparatus that substantially obviates one or more problems due to limitations and disadvantages of the related art.

An aspect of the present disclosure is directed to providing a stereopsis image display apparatus, which may enable a viewer to view a 2D image or a 3D image, based on a selection by the viewer.

Another aspect of the present disclosure is directed to providing a stereopsis image display apparatus including one display panel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a stereopsis image display apparatus including a substrate including a display area and a non-display area, a plurality of pixels provided in the display area of the substrate, the plurality of pixels each including a plurality of subpixels, and a plurality of lenses provided on the plurality of pixels, wherein each of the plurality of subpixels includes a two-dimensional (2D) subpixel and a three-dimensional (3D) subpixel, and each of the plurality of lenses is provided to overlap the 3D subpixel.

In the present disclosure, a 2D image may be displayed through a 2D subpixel in a 2D image mode, and a 3D image may be displayed through a 3D subpixel in a 3D image mode. In the present disclosure, a 2D image or a 3D image may be viewed based on a selection by a viewer.

Moreover, the present disclosure, a lens for implementing a 3D image may be included in a display panel, and thus, it may not be required to manufacture a separate 3D optical cell. Accordingly, the present disclosure may implement process optimization, and moreover, may decrease the manufacturing cost and production energy. Also, the present disclosure may prevent the occurrence of Moire and may reduce a thickness and a weight, thereby implementing lightness.

Moreover, the present disclosure may adjust a length of a 3D subpixel on the basis of a viewing environment, and thus, may be applied to various applications and may increase a lifetime of a light emitting device. Accordingly, the present disclosure may realize high emission efficiency with low power, and moreover, may reduce power consumption.

Moreover, in the present disclosure, a barrier layer may be provided between a 2D subpixel and a 3D subpixel, and thus, may prevent light emitted from a 2D subpixel from traveling to a 3d subpixel. The present disclosure may implement a luminance profile for each viewing angle in the 2D image mode, similarly to a display apparatus which displays only a 2D image.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
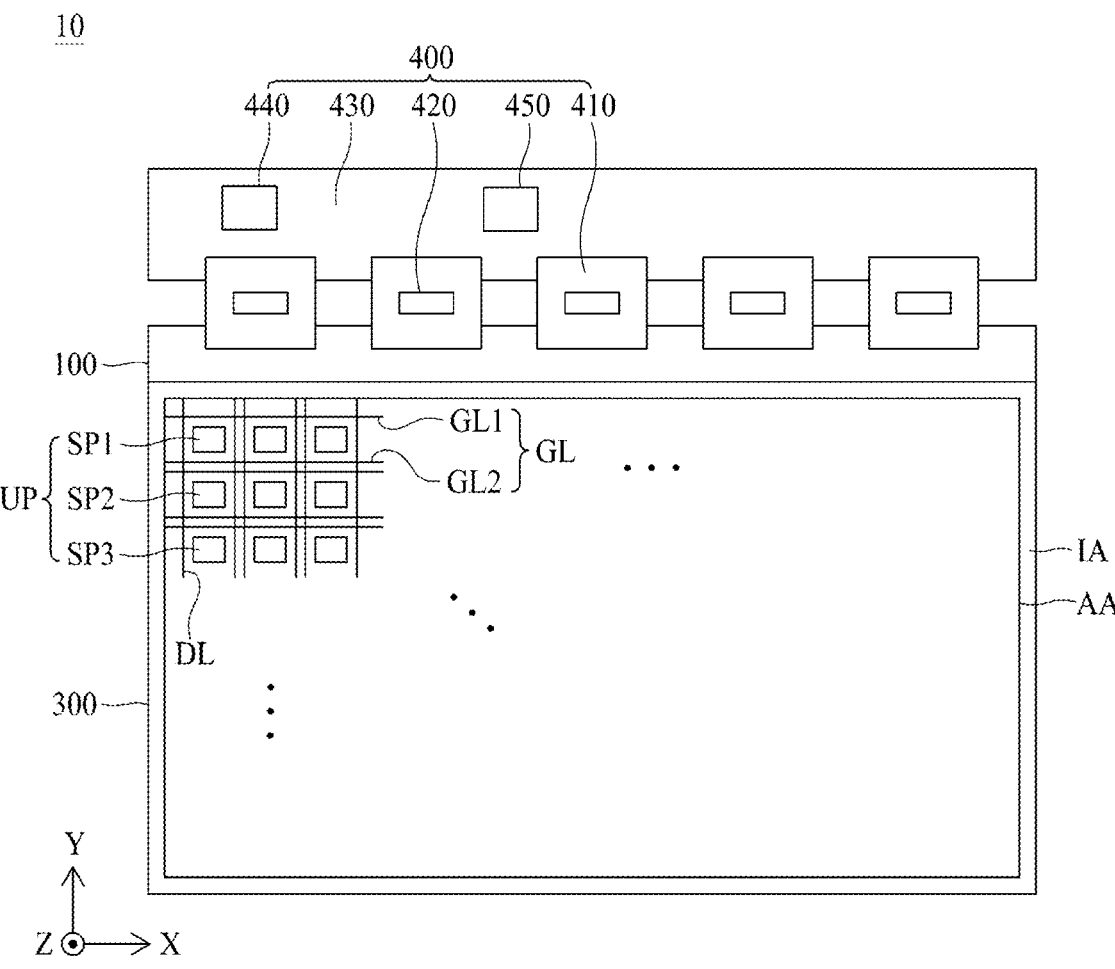
FIG. 1 is a diagram schematically illustrating a stereopsis image display apparatus according to an embodiment of the present disclosure.

Advantages and features of the present disclosure, and implementation methods thereof will be clarified through following embodiments described with reference to the accompanying drawings. The present disclosure may however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a dimension (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a diagram schematically illustrating a stereopsis image display apparatus 10 according to an embodiment of the present disclosure.

The stereopsis image display apparatus 10 according to an embodiment of the present disclosure may be implemented as a flat display apparatus such as a liquid crystal display (LCD) apparatus, a field emission display (FED) apparatus, a plasma display panel (PDP), or an organic light emitting display (OLED) apparatus. In embodiments of the present disclosure, an example where the stereopsis image display apparatus 10 is implemented as an organic light emitting display apparatus will be mainly described, but the present disclosure is not limited thereto.

Referring to FIG. 1, the stereopsis image display apparatus 10 according to one embodiment of the present disclosure includes a first substrate 100, a plurality of unit pixels UP, and a second substrate 300.

The first substrate 100 is a thin film transistor array substrate and may include glass or a plastic material. The first substrate 100 may be divided into a display area AA and a non-display area IA.

The non-display area IA is an area in which an image is not displayed, and the non-display area IA corresponds to an area excluding the display area AA. The non-display area AA is an edge area of the first substrate 100 surrounding the display area AA, wherein the non-display area AA may have a relatively narrow width, and may be defined as a bezel area. A wiring and a circuit for driving the plurality of unit pixels UP in the display area AA may be disposed in the non-display area IA.

The display area AA is an area in which the plurality of unit pixels UP are provided to display an image, and the display area AA corresponds to the remaining area except for the edge area of the first substrate 100.

The plurality of unit pixels UP are provided in the display area AA. The plurality of unit pixels UP may be arranged in such a way that each of the plurality of unit pixels UP has a first reference pixel distance preset along a first direction (e.g., X-axis direction) and has a second reference pixel distance preset along a second direction (e.g., Y-axis direction) in the display area AA. Herein, the first reference pixel distance may be defined as a distance between the centers of two adjacent unit pixels UP along the first direction (e.g., X-axis direction), and the second reference pixel distance may be defined as a distance between the centers of two adjacent unit pixels along the second direction (e.g., Y-axis direction).

Each of the plurality of unit pixels UP may include a plurality of subpixels SP1, SP2, and SP3. For example, each of the plurality of unit pixels UP may include a red subpixel SP1 configured to emit red light, a green subpixel SP2 configured to emit green light, and a blue subpixel SP3 configured to emit blue light. In another example, each of the plurality of unit pixels UP may include a white subpixel configured to emit white light.

The first substrate 100 may include a plurality of pixels UP and a plurality of pixel driving lines in the display area AA.

The pixel driving lines may be provided on a front surface of the first substrate 100 and may transfer a signal needed for each of a plurality of subpixels SP1, SP2, and SP3. In an embodiment, the pixel driving lines may include a plurality of gate lines GL and a plurality of data lines DL.

The plurality of gate lines GL may extend in a first direction (e.g., X-axis direction) on the front surface of the first substrate 100 and may be arranged apart from one another in a second direction (e.g., Y-axis direction). Each of the plurality of gate lines GL may transfer a scan signal to each of the plurality of subpixels SP1, SP2, and SP3. The plurality of gate lines GL according to an embodiment of the present disclosure may include a first gate line GL1 and a second gate line GL2. The first gate line GL1 may transfer the scan signal to a 2D subpixel of the plurality of subpixels SP1, SP2, and SP3 in the 2D image mode. The second gate line GL2 may transfer the scan signal to a 3D subpixel of the plurality of subpixels SP1, SP2, and SP3 in the 3D image mode. Details of the 2D subpixel and the 3D subpixel will be described below with reference to FIGS. 2 to 9.

The plurality of data lines DL may be arranged to intersect with the plurality of gate lines GL on the front surface of the first substrate 100. The plurality of data lines DL may extend in the second direction (e.g., Y-axis direction) and may be arranged apart from one another in the first direction (e.g., X-axis direction). Each of the plurality of data lines DL may transfer a data voltage of each of the plurality of subpixels SP1, SP2, and SP3.

In an embodiment, the pixel driving lines may further include a plurality of driving power lines and a plurality of common power lines. The plurality of driving power lines may be arranged in parallel with the plurality of data lines DL, on the front surface of the first substrate 100. Each of the plurality of driving power lines may transfer a pixel driving power, supplied from the outside, to adjacent subpixels SP1, SP2, and SP3.

The plurality of common power lines may be arranged in parallel with each of the plurality of gate lines GL, on the front surface of the first substrate 100. Each of the plurality of common power lines may transfer a common power, supplied from the outside, to adjacent subpixels SP1, SP2, and SP3.

Each of the plurality of subpixels SP1, SP2, and SP3 may be provided in a subpixel area defined by a gate line GL and a data line DL. Each of the plurality of subpixels SP1, SP2, and SP3 may be defined as a minimum-unit area which actually emits light.

According to one embodiment, the stereopsis image display apparatus 10 may further include a scan driver and a panel driver 400.

The scan driver generates a scan pulse according to a gate control signal inputted from the panel driver 400 and supplies the scan pulse to the gate line GL. The scan driver may be provided in the non-display area IA at the left and/or right side of the display area AA or may be provided in the display area AA. The scan driver may be provided in the non-display area IA or display area AA capable of supplying the scan pulse to the gate line GL. The scan driver may be formed by a gate driver in panel GIP method, a gate driver in active area GIA method, or a tape automated bonding TAB method.

The panel driver 400 is connected to a pad portion prepared in the non-display area IA of the first substrate 100 and is configured to display an image corresponding to image data supplied from a host system on the display area AA. The panel driver 400 according to one embodiment may include a plurality of data flexible circuit films 410, a plurality of data driving integrated circuits 420, a printed circuit board 430, a timing controller 440, and a power circuit 450.

Each of the plurality of data flexible circuit films 410 may be attached to the pad portion of the first substrate 100 by a film attaching process. Each of the plurality of data driving integrated circuits 420 may be individually mounted on each of the plurality of data flexible circuit films 420. The data driving integrated circuit 420 receives pixel data and a data control signal provided from the timing controller 440, converts the pixel data into a data voltage for each pixel in an analog form according to the data control signal, and supplies the data voltage to the corresponding data line DL.

The timing controller 440 is mounted on the printed circuit board 430 and receives image data and a timing synchronization signal provided from the host system. The timing controller 440 generates pixel data by aligning image data to be suitable for a pixel arrangement structure of the display area AA based on the timing synchronization signal, and provides the generated pixel data to the data driving integrated circuit 420. In addition, the timing controller 440 may generate each of a data control signal and a gate control signal based on the timing synchronization signal to control the driving timing of each of the plurality of data driving integrated circuits 420 and the scan driver.

The power supply circuit 450 is mounted on the printed circuit board 430 and generates various voltages necessary for displaying an image in the display area AA by using an input power input from the outside and supplies the generated voltages to a corresponding configuration.

Figure 2:
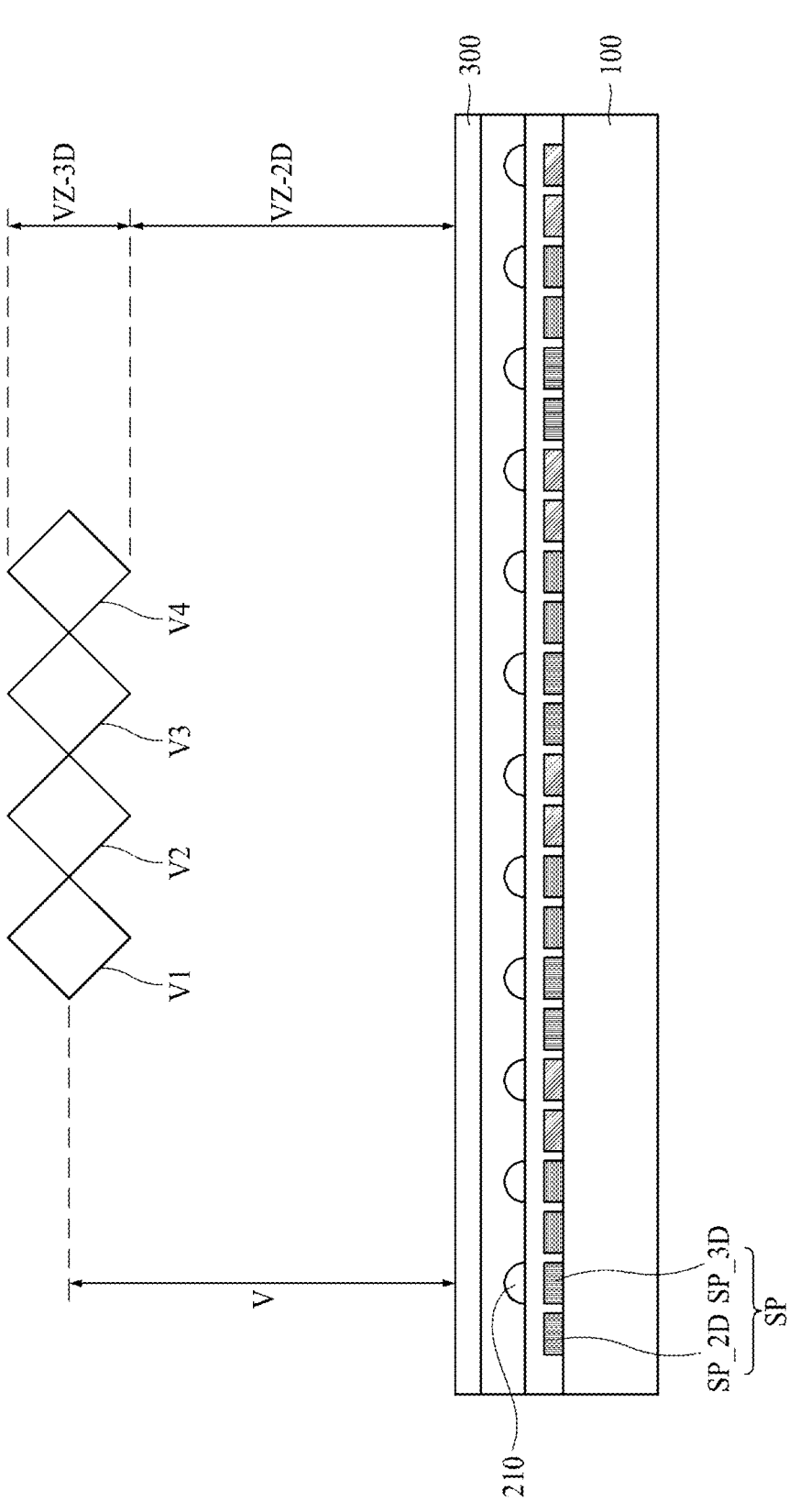
FIG. 2 is a diagram for describing an example of a viewing zone of a stereopsis image display apparatus according to an embodiment of the present disclosure.

FIG. 2 is a diagram for describing an example of a viewing zone of a stereopsis image display apparatus 10 according to an embodiment of the present disclosure.

Referring to FIG. 2, in the stereopsis image display apparatus 10 according to an embodiment of the present disclosure, a plurality of subpixels SP and a plurality of lenses 210 may be provided between the first substrate 100 and the second substrate 300. The plurality of subpixels SP may include a 2D subpixel SP2D which displays a 2D image in the 2D image mode and a 3D subpixel SP3D which displays a 3D image in the 3D image mode.

Each of the plurality of lenses 210 may be provided over the 3D subpixel SP3D to at least partially overlap the 3D subpixel SP3D. The plurality of lenses 210 according to an embodiment of the present disclosure may not be provided over the 2D subpixel SP2D and may not overlap at least a portion of the 2D subpixel SP2D. Light emitted from the 2D subpixel SP2D may be discharged to the outside without passing through the lens 210, and thus, a 2D image may be provided to a viewer. Light emitted from the 3D subpixel SP3D may pass through the lens 210 and may be discharged to the outside, and thus, a 3D image may be provided to the viewer.

The stereopsis image display apparatus 10 according to an embodiment of the present disclosure may display a multi-view image including a plurality of view images by using the 3D subpixel SP3D. The plurality of view images may be displayed as a plurality of views V1 to V4 on a 3D viewing zone VZ-3D apart therefrom by a 3D optimal viewing distance V. Each of the plurality of views V1 to V4 may have a diamond shape, and thus, may be referred to as view diamonds. A width of each of the plurality of views V1 to V4 may be set to a width which is less than or equal to an interval between eyes of a user so that a different image is seen with the eyes of the user. In FIG. 2, four views V1 to V4 are illustrated, but the number of views is not limited thereto. As another example, an $n^{th}$ (where n may be a positive integer) view image may be displayed on an $n^{th}$ view.

The stereopsis image display apparatus 10 according to an embodiment of the present disclosure may be driven in one of the 2D image mode and the 3D image mode. The stereopsis image display apparatus 10 according to an embodiment of the present disclosure may display a 2D image through 2D subpixels SP2D in the 2D image mode. At this time, a viewer may view a 2D image in a 2D viewing zone VZ-2D.

The stereopsis image display apparatus 10 according to an embodiment of the present disclosure may display a 3D image through 3D subpixels SP3D in the 3D image mode. At this time, a viewer may view a 3D image in a 3D viewing zone VZ-3D.

Hereinafter, 2D subpixels SP2D, 3D subpixels SP3D, and a plurality of lenses 210 will be described in more detail with reference to the plurality of lenses 210.

Figure 3:
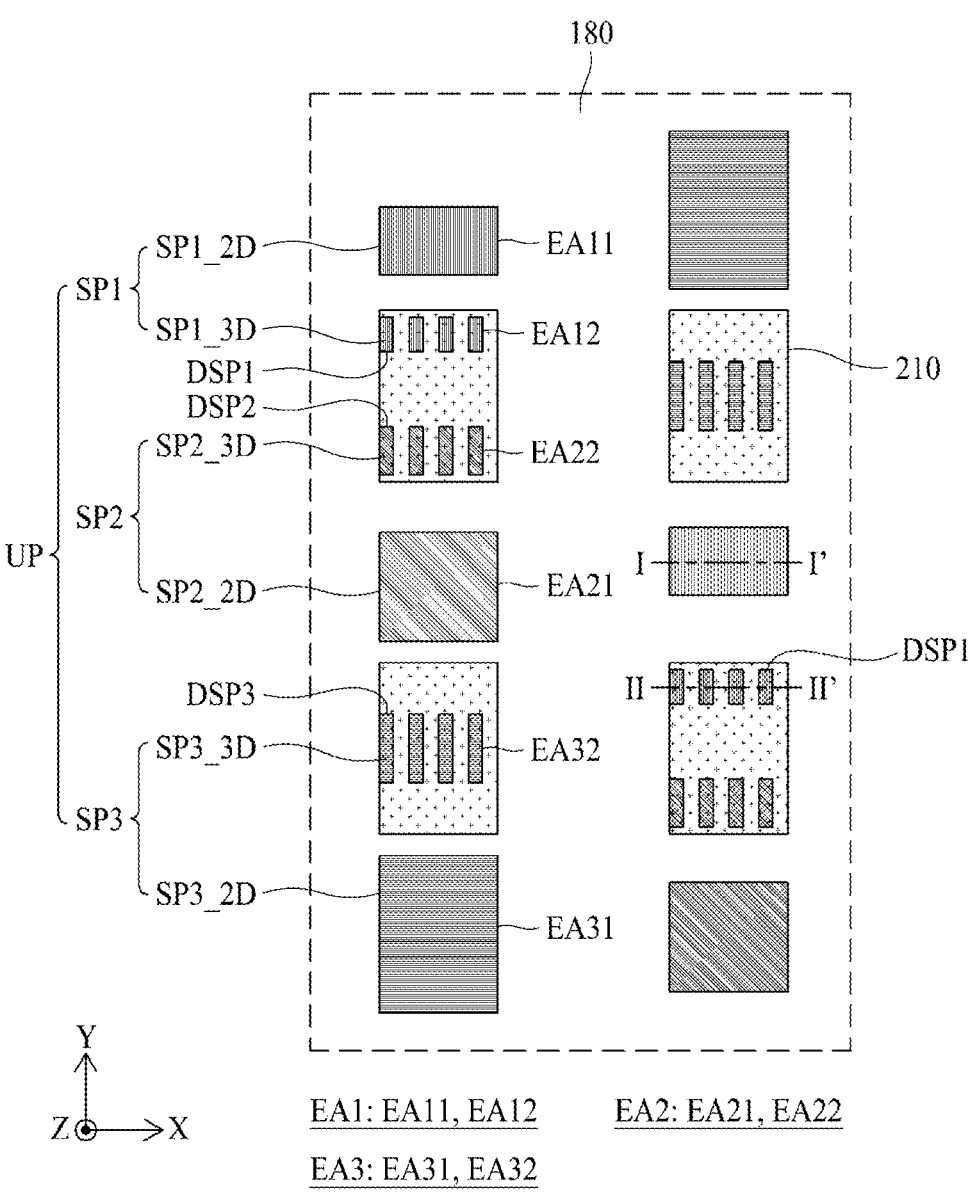
FIG. 3 is a plan view illustrating an example of pixels included in a display area.
Figure 4:
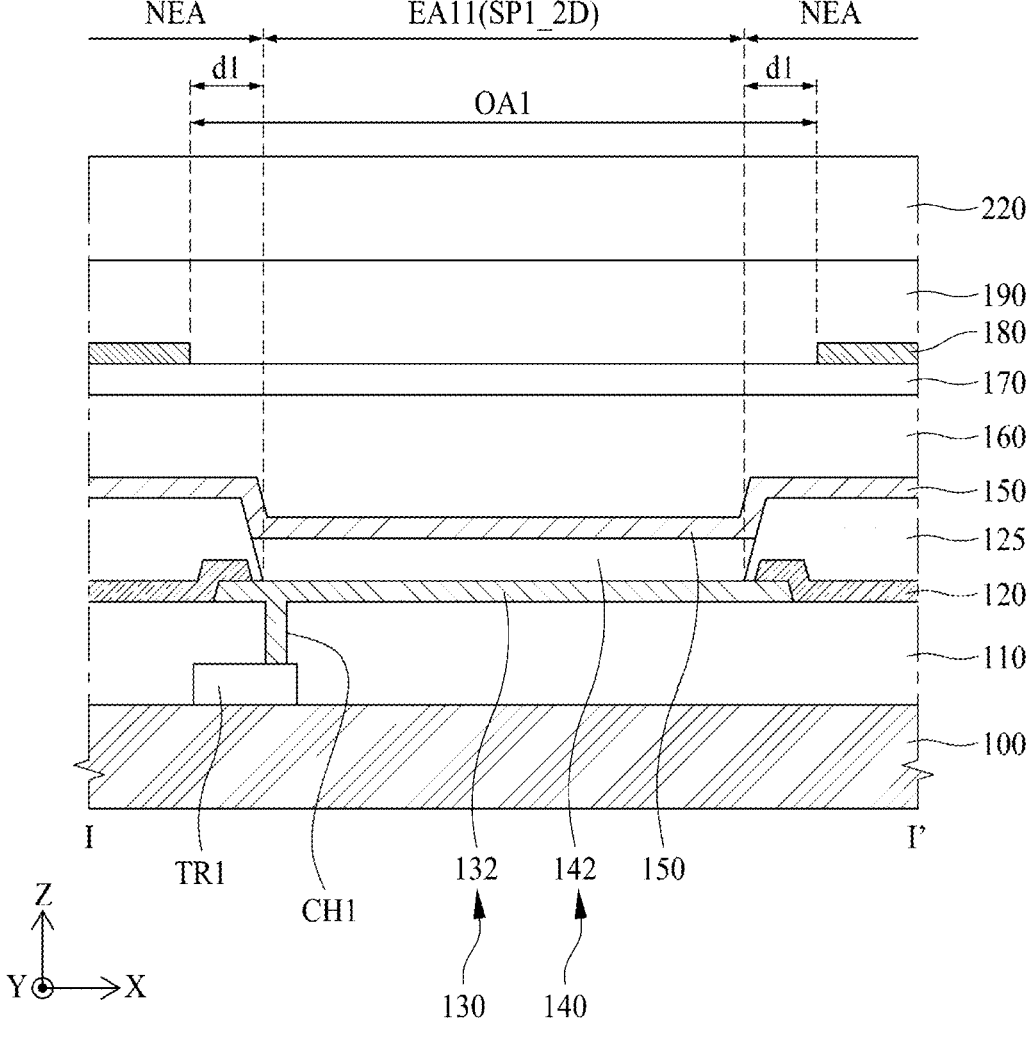
FIG. 4 is a cross-sectional view illustrating an example of line I-I' of FIG. 3.
Figure 5:
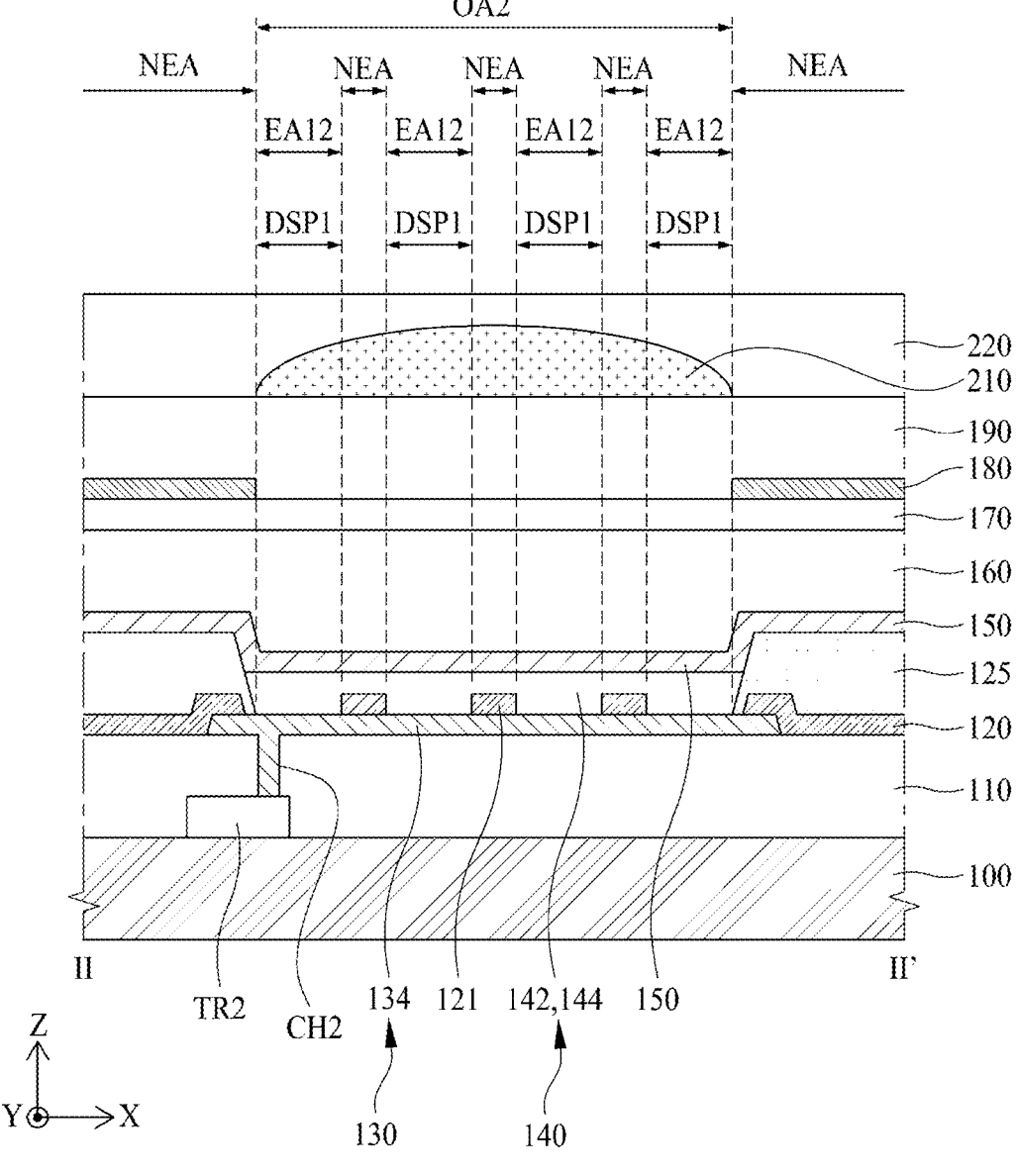
FIG. 5 is a cross-sectional view illustrating an example of line II-II' of FIG. 3.
Figure 6:
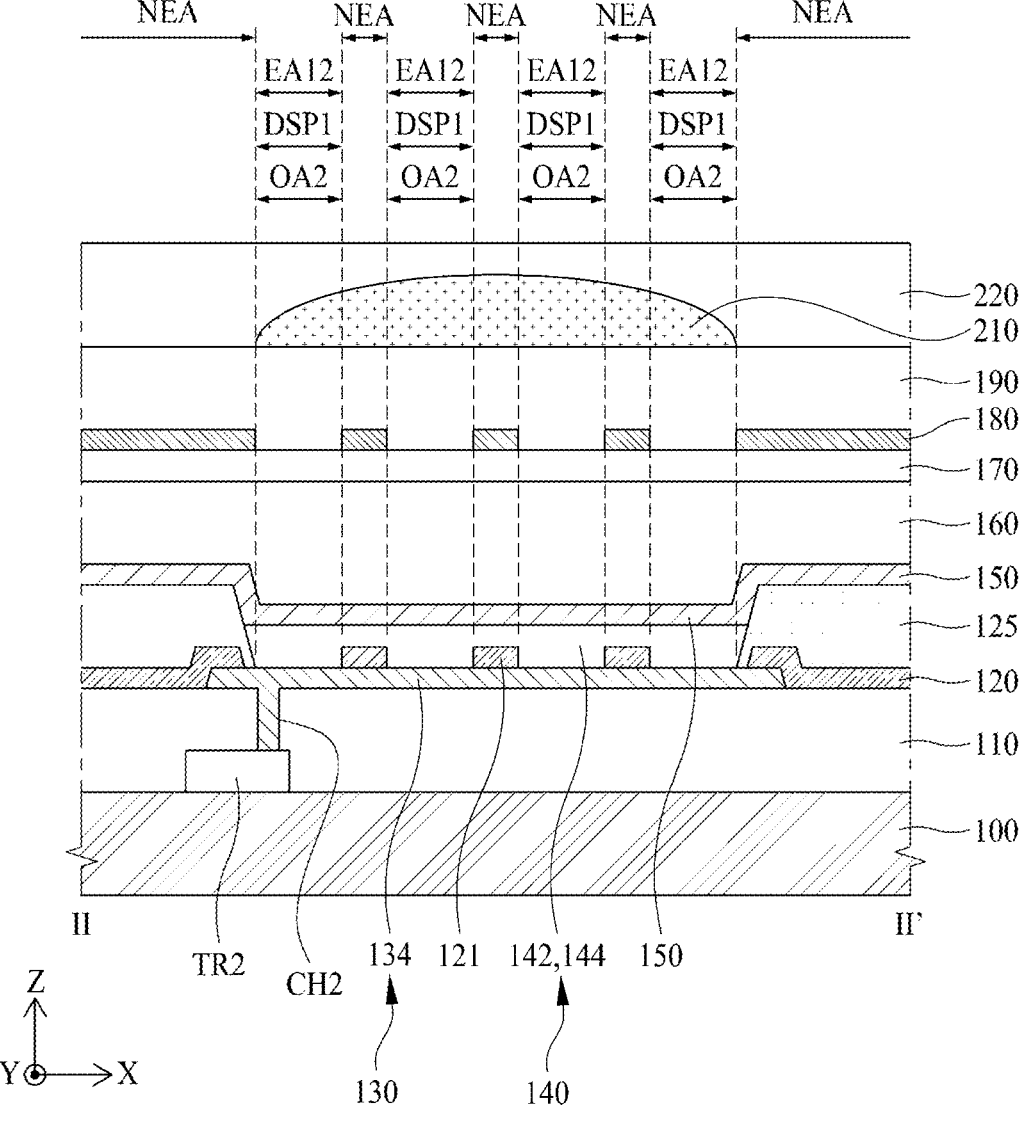
FIG. 6 is a cross-sectional view illustrating a modified embodiment of FIG. 5.
Figure 7:
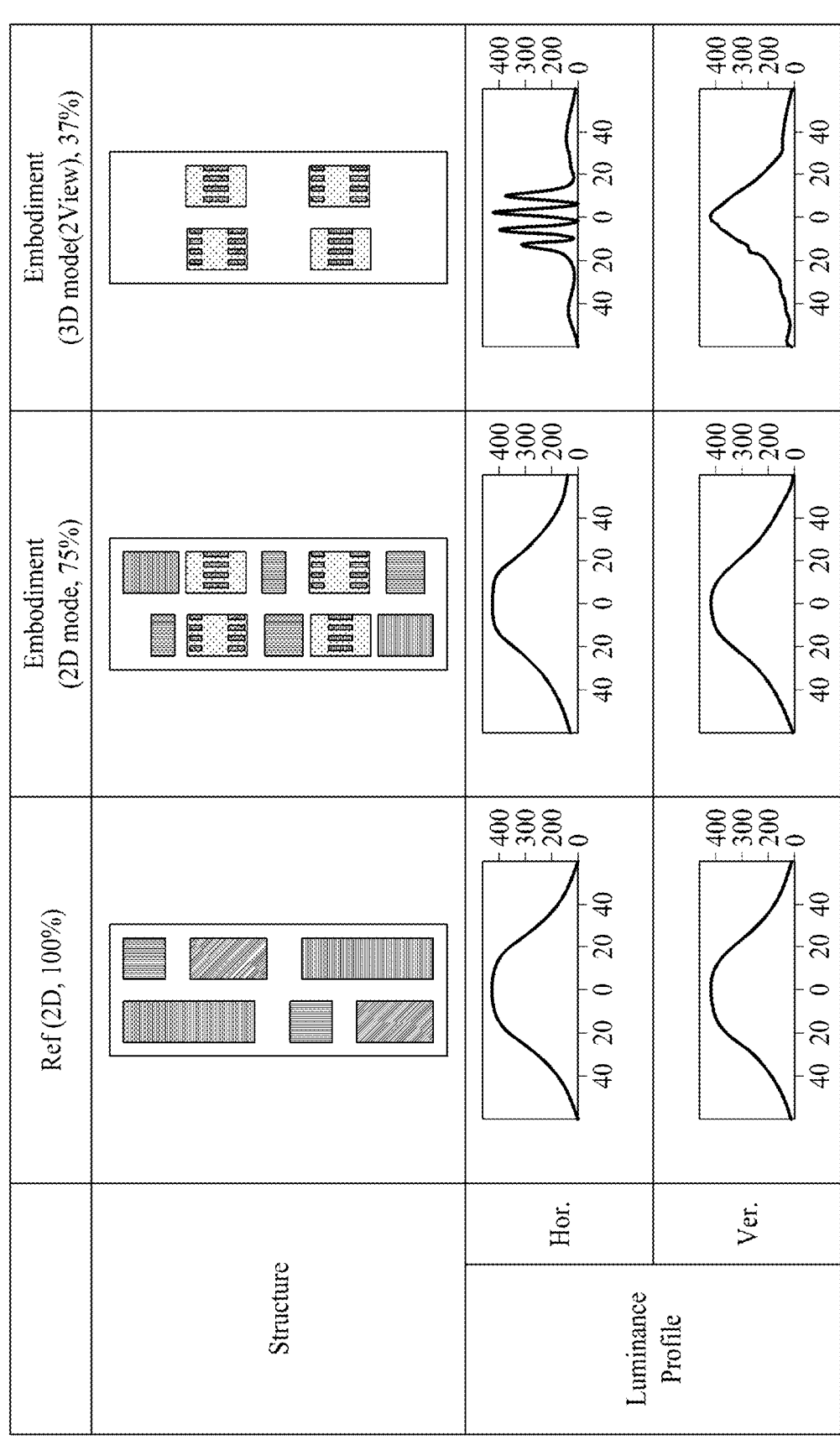
FIG. 7 is a diagram illustrating a luminance profile for each viewing angle in a 2D image mode and a 3D image mode in a stereopsis image display apparatus according to an embodiment of the present disclosure.

FIG. 3 is a plan view illustrating an example of pixels included in a display area, FIG. 4 is a cross-sectional view illustrating an example of line I-I' of FIG. 3, FIG. 5 is a cross-sectional view illustrating an example of line II-II' of FIG. 3, and FIG. 6 is a cross-sectional view illustrating a modified embodiment of FIG. 5. FIG. 7 is a diagram illustrating a luminance profile for each viewing angle in a 2D image mode and a 3D image mode in a stereopsis image display apparatus according to an embodiment of the present disclosure.

Referring to FIGS. 3 to 5, the stereopsis image display apparatus 10 according to an embodiment of the present disclosure may include a plurality of pixels UP in the display area AA, and as illustrated in FIG. 2, each of the plurality of pixels UP may include a first subpixel SP1, a second subpixel SP2, and a third subpixel SP3.

The first subpixel SP1 may include a first emission area EA1 which emits first color light, the second subpixel SP2 may include a second emission area EA2 which emits second color light, and the third subpixel SP3 may include a third emission area EA3 which emits third color light.

For example, the first to third emission areas EA1, EA2, and EA3 may emit lights of different colors. For example, the first emission area EA1 may emit red light, the second emission area EA2 may emit green light, and the third emission area EA3 may emit blue light. However, the present disclosure is not limited thereto. Also, an arrangement order of the subpixels SP1, SP2, and SP3 may be variously modified. Also, as illustrated in FIG. 3, sizes of the subpixels SP1, SP2, and SP3 may differ, but the present disclosure is not limited thereto. A size order of the subpixels SP1, SP2, and SP3 may be variously changed. Sizes of the subpixels SP1, SP2, and SP3 may be equal to one another.

In an embodiment, each of the plurality of pixels UP may further include a white subpixel which emits white light, for luminance enhancement.

Each of the plurality of subpixels SP1, SP2, and SP3 may include a 2D subpixel and a 3D subpixel. The first subpixel SP1 may include a first 2D subpixel SP1_2D and a first 3D subpixel SP1_3D. Each of the first 2D subpixel SP1_2D and the first 3D subpixel SP1_3D may include the first emission area EA1 which emits the first color light. In this case, the first 2D subpixel SP1_2D may include one first 2D emission area EA11. On the other hand, the first 3D subpixel SP1_3D may be divided in plurality. The first 3D subpixel SP1_3D may include a plurality of first division subpixels DSP1, and each of the plurality of first division subpixels DSP1 may include a first 3D emission area EA12. That is, the first 3D subpixel SP1_3D may include a plurality of first 3D emission areas EA12.

The second subpixel SP2 may include a second 2D subpixel SP2_2D and a second 3D subpixel SP2_3D. Each of the second 2D subpixel SP2_2D and the second 3D subpixel SP2_3D may include the second emission area EA2 which emits the second color light. In this case, the second 2D subpixel SP2_2D may include one second 2D emission area EA21. On the other hand, the second 3D subpixel SP2_3D may be divided in plurality. The second 3D subpixel SP2_3D may include a plurality of second division subpixels DSP2, and each of the plurality of second division subpixels DSP2 may include a second 3D emission area EA22. That is, the second 3D subpixel SP2_3D may include a plurality of second 3D emission areas EA22.

The third subpixel SP3 may include a third 2D subpixel SP3_2D and a third 3D subpixel SP3_3D. Each of the third 2D subpixel SP3_2D and the third 3D subpixel SP3_3D may include the third emission area EA3 which emits the third color light. In this case, the third 2D subpixel SP3_2D may include one third 2D emission area EA31. On the other hand, the third 3D subpixel SP3_3D may be divided in plurality. The third 3D subpixel SP3_3D may include a plurality of third division subpixels DSP3, and each of the plurality of third division subpixels DSP3 may include a third 3D emission area EA32. That is, the third 3D subpixel SP3_3D may include a plurality of third 3D emission areas EA32.

Sizes of the 2D subpixels SP1_2D, SP2_2D, and SP3_2D may differ as illustrated in FIG. 3, but the present disclosure is not limited thereto. A size order of the 2D subpixels SP1_2D, SP2_2D, and SP3_2D may be variously changed. Sizes of the 2D subpixels SP1_2D, SP2_2D, and SP3_2D may be equal to one another.

Moreover, sizes of the 3D subpixels SP1_3D, SP2_3D, and SP3_3D may differ as illustrated in FIG. 3, but the present disclosure is not limited thereto. A size order of the 3D subpixels SP1_3D, SP2_3D, and SP3_3D may be variously changed. Sizes of the 3D subpixels SP1_3D, SP2_3D, and SP3_3D may be equal to one another.

Each of the plurality of subpixels SP1, SP2, and SP3 may include a pixel circuit. The pixel circuit may be provided in a circuit region defined in the subpixels SP1, SP2, and SP3 and may be connected with an adjacent gate line GL and data line DL. The pixel circuit may control a current flowing in a light emitting diode 200 according to a data signal from the data line DL in response to a scan pulse from the gate line GL, based on a pixel driving power supplied through a droving power line. The pixel circuit may include one or more transistors and a capacitor.

The one or more transistors may include a driving transistor TR and switching transistors. The switching transistor may be turned on based on the scan signal supplied to the gate line GL and may transfer a data voltage, supplied through the data line DL, to the driving transistor TR. The capacitor may hold the data voltage transferred from the driving transistor TR during one frame.

The driving transistor TR may be turned on based on a voltage supplied from the switching transistor or a data voltage charged into the capacitor to generate a data current from power supplied through the driving power line and may supply the data current to the light emitting device of each of the subpixels SP1, SP2, and SP3.

The driving transistor TR may be included in each of the 2D subpixel SP2D and the 3D subpixel SP3D. In detail, the driving transistor TR may include a first driving transistor TR1 and a second driving transistor TR2.

The first driving transistor TR1 may be included in each of the 2D subpixels SP1_2D, SP2_2D, and SP3_2D respectively included in the subpixels SP1, SP2, and SP3. The first driving transistor TR1 may be connected with the data line DL, the first gate line GL1, and the 2D subpixels SP1_2D, SP2_2D, and SP3_2D. The first driving transistor TR1 may be turned on by a first emission control signal supplied through the first gate line GL1 in the 2D image mode and may supply a data voltage, supplied through the data line DL, to the 2D subpixels SP1_2D, SP2_2D, and SP3_2D.

The second driving transistor TR2 may be included in each of the 3D subpixels SP1_3D, SP2_3D, and SP3_3D respectively included in the subpixels SP1, SP2, and SP3. The second driving transistor TR2 may be connected with the data line DL, the second gate line GL2, and the 3D subpixels SP1_3D, SP2_3D, and SP3_3D. The second driving transistor TR2 may be turned on by a second emission control signal supplied through the second gate line GL2 in the 3D image mode and may supply a data voltage, supplied through the data line DL, to the 3D subpixels SP1_3D, SP2_3D, and SP3_3D.

In the stereopsis image display apparatus 10, as illustrated in FIGS. 4 and 5, the first and second driving transistors TR1 and TR2, an insulation layer 110, an insulation pattern layer 120, a bank 125, a first electrode 130, an organic emission layer 140, a second electrode 150, a first planarization layer 160, a barrier layer 180, a second planarization layer 190, a plurality of lenses 210, and a third planarization layer 220 may be provided over the first substrate 100. The barrier layer may be an insulator or other light blocking material or light absorbing material.

The first driving transistor TR1 and the second driving transistor TR2 may be provided on the first substrate 100. The first driving transistor TR1 may be included in each of the plurality of 2D subpixels SP1_2D, SP2_2D, and SP3_2D. The second driving transistor TR2 may be included in each of the plurality of 3D subpixels SP1_3D, SP2_3D, and SP3_3D. Each of the first driving transistor TR1 and the second driving transistor TR2 may include an active layer, a gate electrode, a source electrode, and a drain electrode.

The insulation layer 110 may be provided over the first driving transistor TR1 and the second driving transistor TR2. The insulation layer 110 may include an inorganic layer (for example, silicon oxide (SiOx), silicon nitride (SiNx), or a multilayer thereof), but is not limited thereto. The insulation layer 110 may include an organic layer, and for example, may include acryl resin, epoxy resin, phenolic resin, polyamide resin, or polyimide resin. Alternatively, the insulation layer 110 may include a multilayer including at least one inorganic layer and at least one organic layer.

A plurality of light emitting devices each including the first electrode 130, the organic emission layer 140, and the second electrode 150 may be provided over the insulation layer 110. The insulation pattern layer 120, and the bank 125 may be further provided over the insulation layer 110.

The first electrode 130 may be provided over the insulation layer 110 for each of the subpixels SP1, SP2, and SP3. The first electrode 130 may be divisionally provided in the 2D subpixels SP1_2D, SP2_2D, and SP3_2D and the 3D subpixels SP1_3D, SP2_3D, and SP3_3D, in each of the subpixels SP1, SP2, and SP3. The first electrode 130 included in each of the subpixels SP1, SP2, and SP3 may include a first sub electrode 132 disposed in the 2D subpixels SP1_2D, SP2_2D, and SP3_2D and a second sub electrode 134 disposed in the 3D subpixels SP1_3D, SP2_3D, and SP3_3D. The first sub electrode 132 and the second sub electrode 134 may be disposed apart from each other on the same layer and may not electrically be connected with each other.

The first sub electrode 132, as illustrated in FIG. 4, may be provided in the 2D subpixels SP1_2D, SP2_2D, and SP3_2D and may electrically be connected with a source electrode or a drain electrode of the first driving transistor TR1 through a first contact hole CH1. Therefore, a data voltage may be applied from the first transistor TR1 to the first sub electrode 132 in the 2D image mode. On the other hand, the first sub electrode 132 may not be connected with the second driving transistor TR2, and thus, in the 3D image mode, the data voltage for emitting light may not be applied thereto.

The second sub electrode 134, as illustrated in FIG. 5, may be provided in the 3D subpixels SP1_3D, SP2_3D, and SP3_3D and may electrically be connected with a source electrode or a drain electrode of the second driving transistor TR2 through a second contact hole CH2. Therefore, a data voltage may be applied from the second transistor TR2 to the second sub electrode 134 in the 3D image mode. On the other hand, the second sub electrode 134 may not be connected with the first driving transistor TR1, and thus, in the 2D image mode, the data voltage for emitting light may not be applied thereto. Said differently, the sub electrode 134 is electrically isolated from the first driving transistor TR1.

The first electrode 130 including the first sub electrode 132 and the second sub electrode 134 may include a metal material having a high reflectance, or may be formed in a stack structure of a transparent metal material and a metal material having a high reflectance. For example, the first electrode 130 may include a metal material having a high reflectance such as a stack structure (Ti/Al/Ti) of aluminum (Al) and titanium (Ti), a stack structure (ITO/Al/ITO) of Al and indium tin oxide (ITO), a silver (Ag) alloy, a stack structure (ITO/Ag alloy/ITO) of Ag alloy and ITO, a molybdenum titanium (MoTi) alloy, or a stack structure (ITO/MoTi alloy/ITO) of MoTi alloy and ITO. The Ag alloy may be an alloy of Ag, palladium (Pd), and copper (Cu). The MoTi alloy may be an alloy of Mo and Ti. The first electrode 130 may be an anode electrode of the light emitting device.

The bank 125 may be provided over the insulation layer 110. Also, the bank 15 may be formed to at least partially cover an edge of the first electrode 130 and expose at least a portion of the first electrode 130. The bank 125 may be formed to at least partially cover an edge of the first sub electrode 132 and expose at least a portion of the first sub electrode 132. The bank 125 may be formed to at least partially cover an edge of the second sub electrode 134 and expose at least a portion of the second sub electrode 134. Accordingly, the bank 125 may solve a problem where emission efficiency is reduced because a current concentrates on an end of each of the first sub electrode 132 and the second sub electrode 134.

The bank 125 may define the emission areas EA1, EA2, and EA3 of the subpixels SP1, SP2, and SP3. The emission areas EA1, EA2, and EA3 of the subpixels SP1, SP2, and SP3 may represent a region where the first electrode 130, the organic emission layer 140, and the second electrode 150 are sequentially stacked, and thus, a hole from the first electrode 130 and an electron from the second electrode 150 are combined with each other in the organic emission layer 140 to emit light. In this case, a region where the bank 125 is formed may be a non-emission area NEA because light is not emitted therefrom, and a region where the bank 125 is not formed and the first electrode 130 is exposed may be an emission area EA.

Moreover, the bank 125 may define 2D emission areas EA11, EA21, and EA31 and 3D emission areas EA12, EA22, and EA32 in the emission areas EA1, EA2, and EA3.

The bank 125 may be provided between the 2D emission areas EA11, EA21, and EA31 and the 3D emission areas EA12, EA22, and EA32. In this case, a region where the bank 125 is formed may be a non-emission area NEA because light is not emitted therefrom, and a region where the bank 125 is not formed and the first electrode 130 is exposed may be an emission area EA. However, in a case where the 3D emission areas EA12, EA22, and EA32 are provided in plurality, the 3D emission areas EA12, EA22, and EA32 may be defined by the insulation pattern layer 120. The insulation pattern layer 120 covers ends of the first sub electrode 132.

The insulation pattern layer 120 may be provided between the insulation layer 110 and the bank 125 and may be provided on the first electrode 130 which is exposed without the bank 125 being formed. The insulation pattern layer 120 may be formed to at least partially cover an edge of the first sub electrode 132 and expose at least a portion of the first sub electrode 132 in the 2D subpixels SP1_2D, SP2_2D, and SP3_2D. The bank 125 may be provided to at least partially cover the insulation pattern layer 120 in the 2D subpixels SP1_2D, SP2_2D, and SP3_2D.

Furthermore, the insulation pattern layer 120 may be formed to at least partially cover an edge of the second sub electrode 134 and expose at least a portion of the second sub electrode 134 in the 3D subpixels SP1_3D, SP2_3D, and SP3_3D. Also, the insulation pattern layer 120 may include a plurality of patterns 121 which cover at least a portion of an upper surface of the second sub electrode 134 that is not covered by the bank. The plurality of patterns 121 may be arranged apart from one another at a certain interval and may define a plurality of 3D emission areas EA12, EA22, and EA32. The plurality of patterns 121 may be referred to as light blocking portions of the insulation pattern layer 120 that are between ends of the insulation pattern layer 120. The portions 121 are spaced from each other.

The plurality of 3D emission areas EA12, EA22, and EA32 may represent a region where the second sub electrode 134, the organic emission layer 140, and the second electrode 150 are sequentially stacked. In this case, a region where the pattern 121 of the insulation pattern layer 120 is formed may not emit light because the pattern 121 is provided between the second sub electrode 134 and the organic emission layer 140. Accordingly, the region where the pattern 121 of the insulation pattern layer 120 is formed may be a non-emission area NEA. Also, a region where the pattern 121 of the insulation pattern layer 120 is not formed and the second sub electrode 134 is exposed may be the emission areas EA12, EA22, and EA32.

The bank 125 may include an organic layer such as acryl resin, epoxy resin, phenolic resin, polyamide resin, or polyimide resin. The insulation pattern layer 120 may include an inorganic layer (for example, SiOx or SiNx), but is not limited thereto. The insulation pattern layer 120 may include an organic layer such as the bank 125.

The organic emission layer 140 may be provided on the first electrode 130. The organic emission layer 140 may include a hole transport layer, an emission layer, and an electron transport layer. In this case, when a voltage is applied to the first electrode 130 and the second electrode 150, a hole and an electron may move to the emission layer through the hole transport layer and the electron transport layer and may be combined with each other in the emission layer to emit light.

In an embodiment, the organic emission layer 140 may be formed for each of subpixels SP1 to SP4. For example, a red emission layer emitting red light may be formed in the first subpixel SP1, a green emission layer emitting green light may be formed in the second subpixel SP2, and a blue emission layer emitting blue light may be formed in the third subpixel SP3.

In this case, the organic emission layer 140 may be patterned in the 2D subpixels SP1_2D, SP2_2D, and SP3_2D and the 3D subpixels SP1_3D, SP2_3D, and SP3_3D in each of the subpixels SP1, SP2, and SP3. The organic emission layer 140 included in each of the subpixels SP1, SP2, and SP3 may include a first organic emission layer 142 disposed in the 2D subpixels SP1_2D, SP2_2D, and SP3_2D and a second organic emission layer 144 disposed in the 3D subpixels SP1_3D, SP2_3D, and SP3_3D. The first organic emission layer 142 and the second organic emission layer 144 may be disposed apart from each other on the same layer, but the present disclosure is not limited thereto.

In another embodiment, the first organic emission layer 142 and the second organic emission layer 144 each including an emission layer emitting light having the same color may be connected with each other. For example, the first 2D subpixel SP1_2D may include a first organic emission layer 142 including a red emission layer emitting red light, and the first 3D subpixel SP1_3D may include a second organic emission layer 144 including a red emission layer emitting red light. In this case, the first organic emission layer 142 and the second organic emission layer 144 may be provided to be connected with each other.

The second electrode 150 may be provided over the organic emission layer 140 and the bank 125. The second electrode 150 may be a common layer which is formed in the subpixels SP1, SP2, and SP3 in common.

The second electrode 150 may include a transparent conductive material (TCO), such as ITO or indium zinc oxide (IZO) for transmitting light, or a semi-transmissive conductive material such as magnesium (Mg), Ag, or an alloy of Mg and Ag. When the second electrode layer 140 includes a semi-transmissive conductive material, emission efficiency may increase based on a micro cavity. The second electrode 150 may be a cathode electrode.

The first planarization layer 160 may be provided over the second electrode 150 to planarize a step height caused by the light emitting device. The first planarization layer 160 may be provided to at least partially cover an upper surface of the second electrode 150 and may provide a flat surface on the second electrode 150.

The first planarization layer 160 may include an organic layer such as acryl resin, epoxy resin, phenolic resin, polyamide resin, or polyimide resin.

In an embodiment, in the stereopsis image display apparatus 10, a passivation layer 170 may be further provided between the second planarization layer 160 and the barrier layer 180. The passivation layer 170 may be provided over the second planarization layer 160 to at least partially cover the second planarization layer 160. The passivation layer 170 may prevent oxygen or water from penetrating into the first electrode 130, the organic emission layer 140, or the second electrode 150 of the light emitting device. The passivation layer 170 may include an inorganic layer (e.g., SiOx, SiNx, or a multilayer thereof).

The barrier layer 180 may be provided over the first planarization layer 160. The barrier layer 180 may be included in a layer which is provided between the plurality of light emitting devices and the plurality of lenses 210.

In the barrier layer 180, as illustrated in FIG. 4, a first opening area OA1 may be provided in an area overlapping the 2D subpixels SP1_2D, SP2_2D, and SP3_2D. That is, the barrier layer 180 may be provided to overlap at least a portion of the non-emission area NEA disposed at a periphery of each of the 2D subpixels SP1_2D, SP2_2D, and SP3_2D. The barrier layer 180 may prevent lights, emitted from the 2D subpixels SP1_2D, SP2_2D, and SP3_2D, from traveling to the 3D subpixels SP1_3D, SP2_3D, and SP3_3D. When the lights emitted from the 2D subpixels SP1_2D, SP2_2D, and SP3_2D travel to the 3D subpixels SP1_3D, SP2_3D, and SP3_3D, the lights may be incident on the lenses 210 included in the 3D subpixels SP1_3D, SP2_3D, and SP3_3D. In this case, incident light may be refracted by the lens 210, and thus, may travel in a desired direction.

In the stereopsis image display apparatus 10 according to an embodiment of the present disclosure, the barrier layer 180 may be provided at a periphery of each of the 2D subpixels SP1_2D, SP2_2D, and SP3_2D, and thus, lights emitted from the 2D subpixels SP1_2D, SP2_2D, and SP3_2D may not be affected by the lens 210. Accordingly, the stereopsis image display apparatus 10 according to an embodiment of the present disclosure may implement a luminance profile for each viewing angle in the 2D image mode, similarly to a display apparatus which displays only a 2D image.

Furthermore, the barrier layer 180 may be formed so that the first opening area OA1 has an area which is wider than the 2D subpixels SP1_2D, SP2_2D, and SP3_2D. That is, the 2D subpixels SP1_2D, SP2_2D, and SP3_2D may be provided in the first opening area OA1 of the barrier layer 180. In this case, an edge of the first opening area OA1 of the barrier layer 180 may be apart from an edge of each of the 2D subpixels SP1_2D, SP2_2D, and SP3_2D by a first distance d1 in a horizontal direction.

The first distance d1 may be determined to be an appropriate distance, based on a width of the 2D subpixels SP1_2D, SP2_2D, and SP3_2D and a distance between the light emitting device and the barrier layer 180. When the first distance d1 is excessively reduced, a viewing angle for the lights emitted from the 2D subpixels SP1_2D, SP2_2D, and SP3_2D may be excessively narrowed in 2D image driving. On the other hand, when the first distance d1 increases excessively, a portion of the light emitted from each of the 2D subpixels SP1_2D, SP2_2D, and SP3_2D may be incident on the lens 210. For example, the first distance d1 may be about 6 μm to about 10 μm.

The stereopsis image display apparatus 10 according to an embodiment of the present disclosure may adjust the first distance d1, and thus, may implement a luminance profile for each viewing angle in 2D image driving, similarly to a display apparatus which displays only a 2D image.

In the barrier layer 180, as illustrated in FIG. 5, a second opening area OA2 may be provided in an area overlapping the 3D subpixels SP1_3D, SP2_3D, and SP3_3D. That is, the barrier layer 180 may be provided between the 3D subpixels SP1_3D, SP2_3D, and SP3_3D and the 2D subpixels SP1_2D, SP2_2D, and SP3_2D. The barrier layer 180 may prevent lights, emitted from the 3D subpixels SP1_3D, SP2_3D, and SP3_3D, from traveling to the 2D subpixels SP1_2D, SP2_2D, and SP3_2D. When the lights emitted from the 3D subpixels SP1_3D, SP2_3D, and SP3_3D travel to the 2D subpixels SP1_2D, SP2_2D, and SP3_2D, the lights may not pass through the lens 210, and thus, a 3D image may be implemented.

In the stereopsis image display apparatus 10 according to an embodiment of the present disclosure, the barrier layer 180 may be provided between the 2D subpixels SP1_2D, SP2_2D, and SP3_2D and the 3D subpixels SP1_3D, SP2_3D, and SP3_3D, and thus, the stereopsis image display apparatus 10 may have 3D performance which is equal or similar to a display apparatus displaying a 3D image.

Each of the 3D subpixels SP1_3D, SP2_3D, and SP3_3D may be divided into a plurality of division subpixels DSP1, DPS2, and DSP3 so as to implement a multi-view. In the stereopsis image display apparatus 10 according to an embodiment of the present disclosure, the plurality of division subpixels DSP1, DSP2, and DSP3 may be provided in one of the 3D subpixels SP1_3D, SP2_3D, and SP3_3D by using the plurality of patterns 121 of the insulation pattern layer 120 which is formed on an upper surface of the second sub electrode 134. In this case, as illustrated in FIG. 5, the barrier layer 180 may be provided so that one of the 3D subpixels SP1_3D, SP2_3D, and SP3_3D including the plurality of division subpixels DSP1, DSP2, and DSP3 corresponds to one second opening area OA2. However, the present disclosure is not limited thereto.

In another embodiment, as illustrated in FIG. 6, the barrier layer 180 may be provided so that one of the 3D subpixels SP1_3D, SP2_3D, and SP3_3D corresponds to a plurality of second opening areas OA2. In the barrier layer 180, second opening areas OA2 may be provided to respectively correspond to a plurality of division subpixels DSP1, DSP2, and DSP3 included in one of the 3D subpixels SP1_3D, SP2_3D, and SP3_3D. That is, the second opening area OA2 of the barrier layer 180 may be provided to overlap the division subpixels DSP1, DSP2, and DSP3. In this case, the second opening area OA2 of the barrier layer 180 may have the same area as that of a corresponding division subpixels DSP1, DSP2, and DSP3, but the present disclosure is not limited thereto.

Therefore, the barrier layer 180 may be provided in a region between the plurality of division subpixels DSP1, DSP2, and DSP3. That is, the barrier layer 180 may be provided to overlap at least a portion of the non-emission area NEA where the plurality of patterns 121 of the insulation pattern layer 120 are provided and light is not emitted therefrom.

In a stereopsis image display apparatus 10 according to a modified embodiment of the present disclosure, the barrier layer 180 may be provided in a region between the plurality of division subpixels DSP1, DSP2, and DSP3, and thus, may prevent the occurrence of crosstalk where a plurality of view images are seen to overlap with eyes of a viewer.

The barrier layer 180 may include a material which absorbs light, and for example, may include a black dye which absorbs all of light of a visible wavelength band.

The second planarization layer 190 may be provided on the barrier layer 180 to at least partially cover the barrier layer 180. The second planarization layer 190 may cover a step height caused by the barrier layer 180 to provide a flat surface. The second planarization layer 190 may secure an optical distance between the light emitting device and the plurality of lenses 210, in the 3D subpixels SP1_3D, SP2_3D, and SP3_3D.

The second planarization layer 190 may include an organic layer such as acryl resin, epoxy resin, phenolic resin, polyamide resin, or polyimide resin. The second planarization layer 190 may include a single layer or a plurality of layers.

The plurality of lenses 210 may be provided on the second planarization layer 190. The plurality of lenses 210 may be provided to at least partially overlap the 3D subpixels SP1_3D, SP2_3D, and SP3_3D and may not overlap the 2D subpixels SP1_2D, SP2_2D, and SP3_2D. The plurality of lenses 210 may be arranged apart from one another or otherwise spaced from each other by an adjacent non-emission area.

Each of the plurality of lenses 210 may at least partially overlap one or two 3D subpixels SP1_3D, SP2_3D, and SP3_3D. For example, one lens 210 may be provided to at least partially overlap the first 3D subpixel SP1_3D and the second 3D subpixel SP2_3D disposed adjacent to the first 3D subpixel SP1_3D in a second direction (e.g., a Y-axis direction). As another example, one lens 210 may be provided to at least partially overlap the third 3D subpixel SP3_3D.

The plurality of lenses 210 may be formed to be convex from an upper surface of the second planarization layer 190 and may be provided in a pillar shape extending in the second direction (e.g., the Y-axis direction). In an embodiment, the plurality of lenses 210 may have a cross-sectional surface of a convex lens having a certain curvature or a semicircular shape which is convex in a direction opposite to the plurality of subpixels SP1, SP2, and SP3.

The plurality of lenses 210 may include an organic material having a first refractive index. The first refractive index may be more than 1.5 and 1.6 or more. The plurality of lenses 210 may have a refractive index which differs from that of the second planarization layer 190, but the present disclosure is not limited thereto.

The third planarization layer 220 may be provided on the plurality of lenses 210 to cover the plurality of lenses 210. The third planarization layer 220 may planarize a step height caused by the plurality of lenses 210. The third planarization layer 220 may include an organic material having a refractive index which is lower than that of each of the plurality of lenses 210. That is, the third planarization layer 220 may have a second refractive index which is less than the first refractive index. For example, the third planarization layer 220 may have a refractive index which is less than or equal to 1.5 and is within a range of 1.4 to 1.5.

In the stereopsis image display apparatus 10 according to an embodiment of the present disclosure, the second subpixels SP1_2D, SP2_2D, and SP3_2D and the 3D subpixels SP1_3D, SP2_3D, and SP3_3D may be respectively provided in the subpixels SP1, SP2, and SP3. The stereopsis image display apparatus 10 according to an embodiment of the present disclosure may display a 2D image through the second subpixels SP1_2D, SP2_2D, and SP3_2D in the 2D image mode and may display a 3D image through the 3D subpixels SP1_3D, SP2_3D, and SP3_3D in the 3D image mode. Accordingly, the stereopsis image display apparatus 10 according to an embodiment of the present disclosure may enable a viewer to view a 2D image or a 3D image, based on a selection by the viewer.

Moreover, in the stereopsis image display apparatus 10 according to an embodiment of the present disclosure, the lens 210 for implementing a 3D image may be included in the display panel. Therefore, in the stereopsis image display apparatus 10 according to an embodiment of the present disclosure, because it is not required to manufacture a separate 3D optical cell, process optimization may be implemented, and moreover, the manufacturing cost and production energy may be reduced. Also, the stereopsis image display apparatus 10 according to an embodiment of the present disclosure may prevent the occurrence of Moire. Also, in the stereopsis image display apparatus 10 according to an embodiment of the present disclosure, a thickness and a weight may be reduced, thereby implementing lightness.

Moreover, in the stereopsis image display apparatus 10 according to an embodiment of the present disclosure, the 3D subpixels SP1_3D, SP2_3D, and SP3_3D may be divided into the plurality of division subpixels DSP1, DSP2, and DSP3, and thus, a multi-view may be implemented.

Moreover, in the stereopsis image display apparatus 10 according to an embodiment of the present disclosure, the plurality of division subpixels DSP1, DSP2, and DSP3 may be formed to be long in the second direction (e.g., the Y-axis direction) instead of the first direction (e.g., the X-axis direction).

When the plurality of division subpixels DSP1, DSP2, and DSP3 are formed to be long in the first direction (e.g., the X-axis direction), the lens 210 overlapping the plurality of division subpixels DSP1, DSP2, and DSP3 may increase in width in the first direction (e.g., the X-axis direction). As described above, when a size of the lens 210 increases, an optical distance between the lens 210 and the light emitting device of each of the 3D subpixels SP1_3D, SP2_3D, and SP3_3D may inevitably increase for maintaining a 3D optimal viewing distance. A thickness of the second planarization layer 190 may increase, and thus, a thickness of the stereopsis image display apparatus 10 may increase. Also, as an overlap region between views increases, 3D crosstalk may increase.

In the stereopsis image display apparatus 10 according to an embodiment of the present disclosure, the plurality of division subpixels DSP1, DSP2, and DSP3 may be formed to be long in the second direction (e.g., the Y-axis direction), an increase in size of the lens 210 and thickness of an apparatus may be prevented, and an increase in 3D crosstalk may be prevented.

Moreover, in the stereopsis image display apparatus 10 according to an embodiment of the present disclosure, a length of each of the plurality of division subpixels DSP1, DSP2, and DSP3 in the second direction (e.g., the Y-axis direction) may be adjusted based on a viewing environment, and thus, the stereopsis image display apparatus 10 may be applied to various applications. In a case where the stereopsis image display apparatus 10 is used in an environment where a viewer views a 3D image mainly, a length of each of the plurality of division subpixels DSP1, DSP2, and DSP3 in the second direction (e.g., the Y-axis direction) may be formed to longer than a reference length. Accordingly, in the stereopsis image display apparatus 10 according to an embodiment of the present disclosure, an area of the 3D subpixels SP1_3D, SP2_3D, and SP3_3D may increase, and moreover, a lifetime of the light emitting device included in each of the 3D subpixels SP1_3D, SP2_3D, and SP3_3D may increase.

On the other hand, in a case where the stereopsis image display apparatus 10 is used in an environment where a viewer views a 2D image mainly, a length of each of the plurality of division subpixels DSP1, DSP2, and DSP3 in the second direction (e.g., the Y-axis direction) may be formed to shorter than the reference length. Accordingly, in the stereopsis image display apparatus 10 according to an embodiment of the present disclosure, an area of the 3D subpixels SP1_3D, SP2_3D, and SP3_3D may decrease, and an area of the 2D subpixels SP1_2D, SP2_2D, and SP3_2D may relatively increase. Furthermore, in the stereopsis image display apparatus 10 according to an embodiment of the present disclosure, a lifetime of the light emitting device included in each of the 2D subpixels SP1_2D, SP2_2D, and SP3_2D may increase.

In the stereopsis image display apparatus 10 according to an embodiment of the present disclosure, a length of each of the plurality of division subpixels DSP1, DSP2, and DSP3 in the second direction (e.g., the Y-axis direction) may be adjusted based on a viewing environment, and thus, apparatus lifetime may increase. Accordingly, the stereopsis image display apparatus 10 according to an embodiment of the present disclosure may have high emission efficiency with low power, and moreover, may decrease power consumption.

Moreover, in the stereopsis image display apparatus 10 according to an embodiment of the present disclosure, the barrier layer 180 may be provided between the 2D subpixels SP1_2D, SP2_2D, and SP3_2D and the 3D subpixels SP1_3D, SP2_3D, and SP3_3D, and thus, the barrier layer 180 may prevent lights, emitted from the 2D subpixels SP1_2D, SP2_2D, and SP3_2D, from traveling to the 3D subpixels SP1_3D, SP2_3D, and SP3_3D.

Moreover, in the stereopsis image display apparatus 10 according to an embodiment of the present disclosure, an edge of the first opening area OA1 of the barrier layer 180 may be apart from an edge of each of the 2D subpixels SP1_2D, SP2_2D, and SP3_2D in a horizontal direction. Accordingly, as illustrated in FIG. 7, the stereopsis image display apparatus 10 according to an embodiment of the present disclosure may implement a luminance profile for each viewing angle in the 2D image mode, similarly to a display apparatus Ref which displays only a 2D image.

In the stereopsis image display apparatus 10 according to an embodiment of the present disclosure, the barrier layer 180 may be provided in a region between the plurality of division subpixels DSP1, DSP2, and DSP3, and thus, a luminance profile of each of a plurality of view images for each viewing angle in the 3D image mode may be as shown in FIG. 7. Accordingly, the stereopsis image display apparatus 10 according to an embodiment of the present disclosure may prevent the occurrence of 3D crosstalk where a plurality of view images are seen to overlap with eyes of a viewer.

Moreover, in the stereopsis image display apparatus 10 according to an embodiment of the present disclosure, a thickness of the second planarization layer 190 provided between the barrier layer 180 and the plurality of lenses 210 may be adjusted, and thus, a 3D viewing distance may be easily adjusted.

Moreover, the stereopsis image display apparatus 10 according to an embodiment of the present disclosure may implement a multi-view by shifting positions of the 3D subpixels SP1_3D, SP2_3D, and SP3_3D. The stereopsis image display apparatus 10 according to an embodiment of the present disclosure may implement a multi-view even without the plurality of lenses 210 being inclined.

Figure 8:
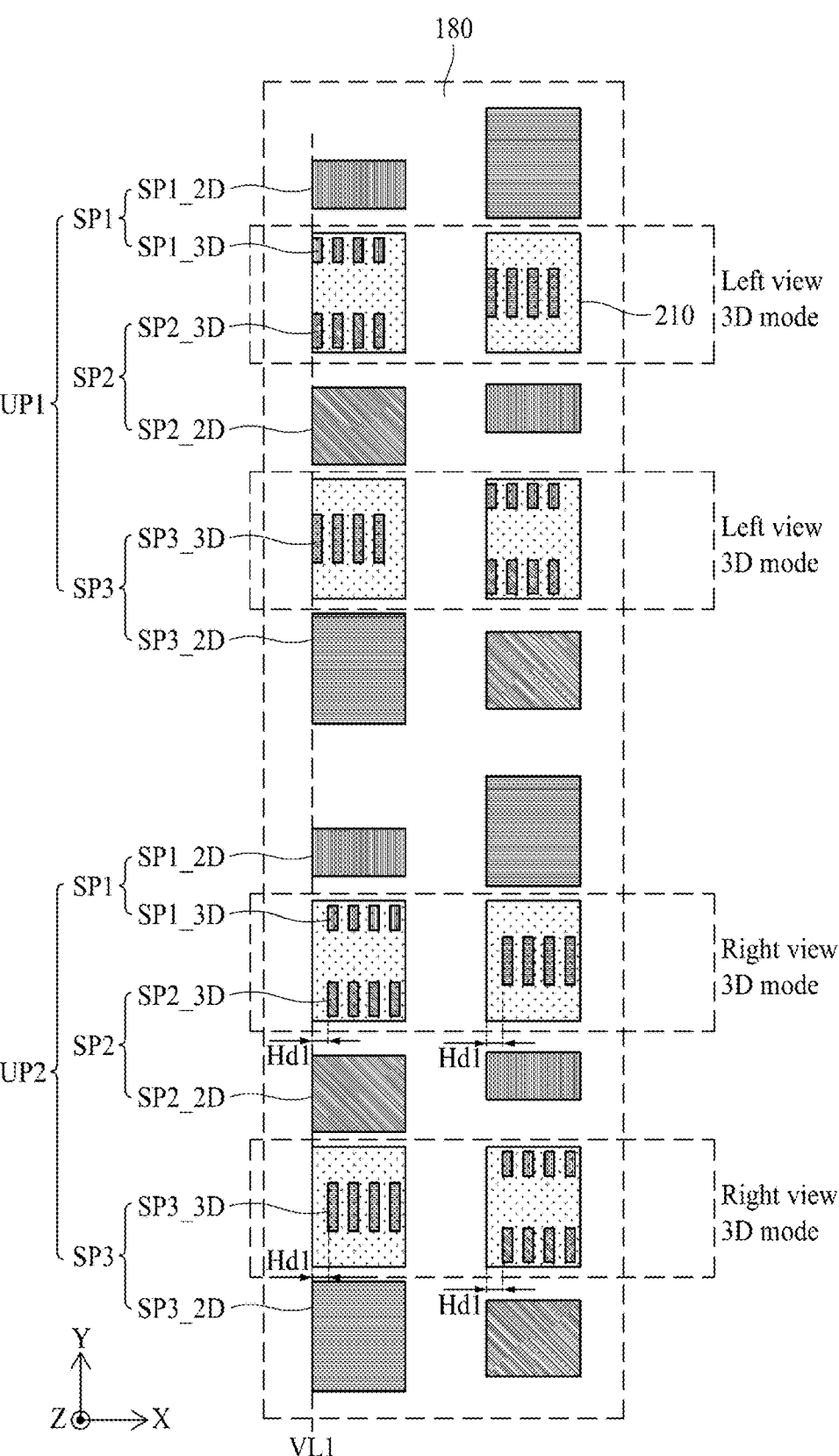
FIG. 8 is a plan view illustrating an example where 3D subpixels are shifted in a 2 view.

FIG. 8 is a plan view illustrating an example where 3D subpixels are shifted in a 2 view.

In the stereopsis image display apparatus 10 according to an embodiment of the present disclosure, 3D subpixels SP1_3D, SP2_3D, and SP3_3D provided in each of pixels UP disposed in a first vertical line VL1 may be shifted by a first horizontal distance Hd1 in a horizontal direction and may be disposed.

In more detail, as illustrated in FIG. 8, the stereopsis image display apparatus 10 according to an embodiment of the present disclosure may include a first pixel UP1 and a second pixel UP2 which is disposed adjacent to the first pixel UP1 in a second direction (e.g., a Y-axis direction).

Each of the first pixel UP1 and the second pixel UP2 may include a first subpixel SP1, a second subpixel SP2, and a third subpixel SP3. A plurality of subpixels SP1, SP2, and SP3 may respectively include 2D subpixels SP1_2D, SP2_2D, and SP3_2D and 3D subpixels SP1_3D, SP2_3D, and SP3_3D. The 3D subpixels SP1_3D, SP2_3D, and SP3_3D may include a plurality of division subpixels DSP1, DSP2, and DSP3.

The 3D subpixels SP1_3D, SP2_3D, and SP3_3D included in the second subpixel UP2 may be shifted by the first horizontal distance Hd1 in the horizontal direction with respect to the 3D subpixels SP1_3D, SP2_3D, and SP3_3D included in the first pixel UP1 and may be disposed.

To provide a more detailed description, one edge of each of the 2D subpixels SP1_2D, SP2_2D, and SP3_2D included in the first pixel UP1 may be disposed in the first vertical line VL1. For example, a left edge of each of the 2D subpixels SP1_2D, SP2_2D, and SP3_2D included in the first pixel UP1 may be disposed in the first vertical line VL1.

One edge of each of the 3D subpixels SP1_3D, SP2_3D, and SP3_3D included in the first pixel UP1 may be disposed in the first vertical line VL1. In this case, one edge of a division subpixel disposed at one side among the plurality of division subpixels DSP1, DSP2, and DSP3 included in each of the 3D subpixels SP1_3D, SP2_3D, and SP3_3D may be disposed in the first vertical line VL1. For example, in each of the 3D subpixels SP1_3D, SP2_3D, and SP3_3D included in the first pixel UP1, a left edge of a division subpixel disposed at a leftmost side among the plurality of division subpixels DSP1, DSP2, and DSP3 may be disposed in the first vertical line VL1.

In this case, the 3D subpixels SP1_3D, SP2_3D, and SP3_3D included in the first pixel UP1 may display a 1-view (left-view) image.

One edge of each of the 3D subpixels SP1_3D, SP2_3D, and SP3_3D included in the second pixel UP2 may be shifted by the first horizontal distance Hd1 with respect to the first vertical line VL1 and may be disposed. In this case, one edge of a division subpixel disposed at one side among the plurality of division subpixels DSP1, DSP2, and DSP3 included in each of the 3D subpixels SP1_3D, SP2_3D, and SP3_3D may be shifted by the first horizontal distance Hd1 with respect to the first vertical line VL1 and may be disposed. For example, in each of the 3D subpixels SP1_3D, SP2_3D, and SP3_3D included in the second pixel UP2, a left edge of a division subpixel disposed at a leftmost side among the plurality of division subpixels DSP1, DSP2, and DSP3 may be shifted by the first horizontal distance Hd1 with respect to the first vertical line VL1 and may be disposed.

In this case, the 3D subpixels SP1_3D, SP2_3D, and SP3_3D included in the second pixel UP2 may display a 2-view (right-view) image. A viewer may see a left-eye image displayed on the 3D subpixels SP1_3D, SP2_3D, and SP3_3D included in the first pixel UP1 with left eye and may see a right-eye image displayed on the 3D subpixels SP1_3D, SP2_3D, and SP3_3D included in the second pixel UP2 with right eye, in a 3D viewing zone. The viewer may feel three-dimensionality, based on a binocular parallax between the left eye and the right eye.

Furthermore, in the second pixel UP2, even when the 3D subpixels SP1_3D, SP2_3D, and SP3_3D are shifted by the first horizontal distance Hd1 with respect to the first vertical line VL1 and are disposed, the 2D subpixels SP1_2D, SP2_2D, and SP3_2D may be disposed in the first vertical line VL1. That is, one edge of each of the 2D subpixels SP1_2D, SP2_2D, and SP3_2D included in the second pixel UP2 may be shifted by the first horizontal distance Hd1 with respect to the first vertical line VL1 and may be disposed. For example, a left edge of each of the 3D subpixels SP1_3D, SP2_3D, and SP3_3D included in the second pixel UP2 may be disposed in the first vertical line VL1.

Moreover, one edge of each of a plurality of lenses 210 disposed to overlap the 3D subpixels SP1_3D, SP2_3D, and SP3_3D of the first pixel UP1 and a plurality of lenses 210 disposed to overlap the 3D subpixels SP1_3D, SP2_3D, and SP3_3D of the second pixel UP2 may be disposed in the first vertical line VL1.

In FIG. 8, the stereopsis image display apparatus 10 is illustrated as displaying a 2-view image, but is not limited thereto.

Figure 9:
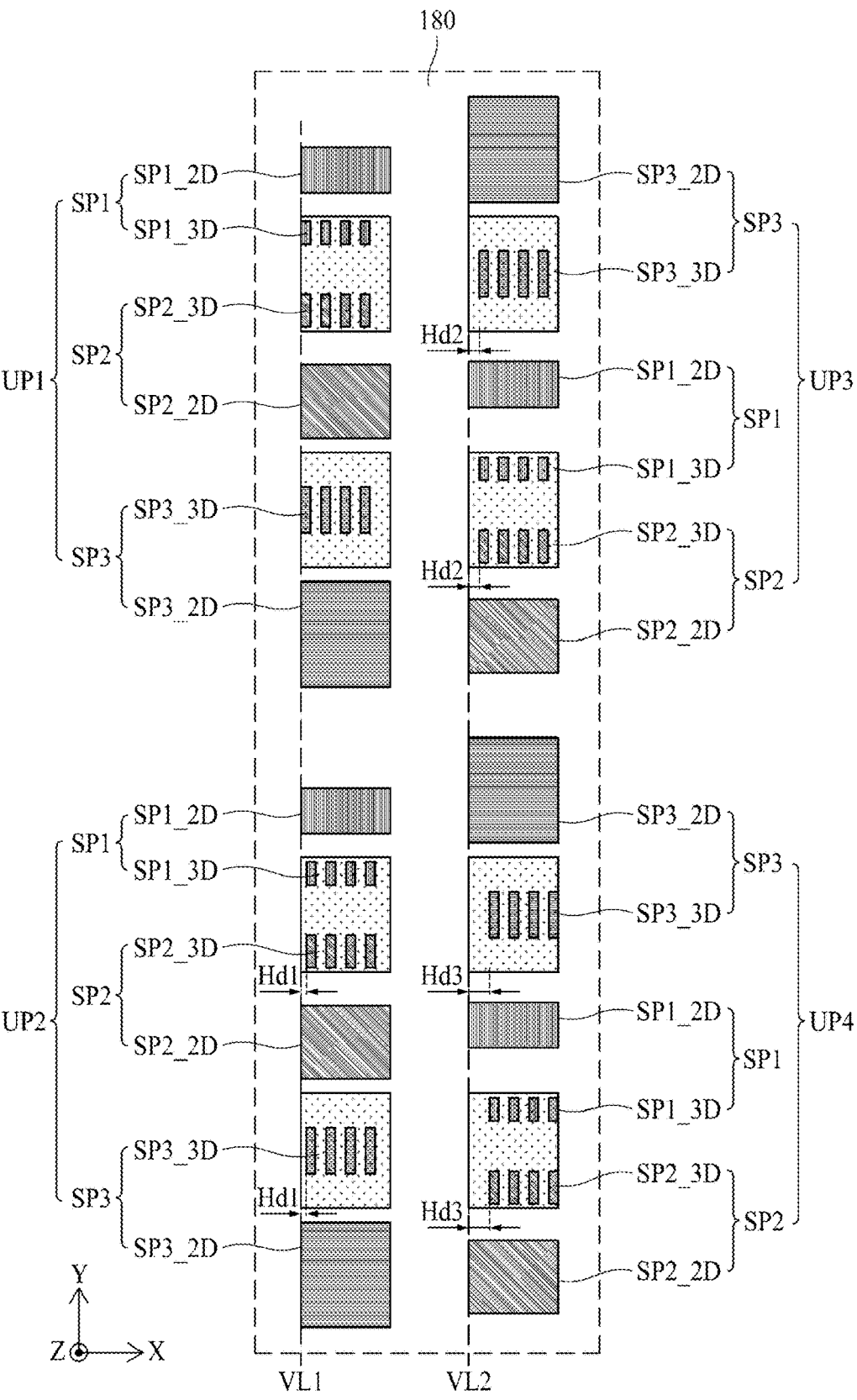
FIG. 9 is a plan view illustrating an example where 3D subpixels are shifted in a 4 view.

FIG. 9 is a plan view illustrating an example where 3D subpixels are shifted in a 4 view.

Referring to FIG. 9, the stereopsis image display apparatus 10 according to an embodiment of the present disclosure may include a first pixel UP1, a second pixel UP2 which is disposed adjacent to the first pixel UP1 in a second direction (e.g., a Y-axis direction), a third pixel UP3 which is disposed adjacent to the first pixel UP1 in a first direction (e.g., an X-axis direction), and a fourth pixel UP4 which is disposed adjacent to the third pixel UP3 in the second direction (e.g., the Y-axis direction).

Each of the first pixel UP1, the second pixel UP2, the third pixel UP3, and the fourth pixel UP4 may include a first subpixel SP1, a second subpixel SP2, and a third subpixel SP3. Each of a plurality of subpixels SP1, SP2, and SP3 may include 2D subpixels SP1_2D, SP2_2D, and SP3_2D and 3D subpixels SP1_3D, SP2_3D, and SP3_3D. The 3D subpixels SP1_3D, SP2_3D, and SP3_3D may include a plurality of division subpixels DSP1 to DSP3.

The 3D subpixels SP1_3D, SP2_3D, and SP3_3D included in the second subpixel UP2 may be shifted by a first horizontal distance Hd1 in a horizontal direction with respect to the 3D subpixels SP1_3D, SP2_3D, and SP3_3D included in the first pixel UP1 and may be disposed. The 3D subpixels SP1_3D, SP2_3D, and SP3_3D included in the third subpixel UP3 may be shifted by a second horizontal distance Hd2 in the horizontal direction with respect to the 3D subpixels SP1_3D, SP2_3D, and SP3_3D included in the first pixel UP1 and may be disposed. The 3D subpixels SP1_3D, SP2_3D, and SP3_3D included in the fourth subpixel UP4 may be shifted by a third horizontal distance Hd3 in the horizontal direction with respect to the 3D subpixels SP1_3D, SP2_3D, and SP3_3D included in the first pixel UP1 and may be disposed.

To provide a more detailed description, one edge of each of the 2D subpixels SP1_2D, SP2_2D, and SP3_2D included in the first pixel UP1 may be disposed in a first vertical line VL1. For example, a left edge of each of the 2D subpixels SP1_2D, SP2_2D, and SP3_2D included in the first pixel UP1 may be disposed in the first vertical line VL1.

One edge of each of the 3D subpixels SP1_3D, SP2_3D, and SP3_3D included in the first pixel UP1 may be disposed in the first vertical line VL1. In this case, one edge of a division subpixel disposed at one side among the plurality of division subpixels DSP1, DSP2, and DSP3 included in each of the 3D subpixels SP1_3D, SP2_3D, and SP3_3D may be disposed in the first vertical line VL1. For example, in each of the 3D subpixels SP1_3D, SP2_3D, and SP3_3D included in the first pixel UP1, a left edge of a division subpixel disposed at a leftmost side among the plurality of division subpixels DSP1, DSP2, and DSP3 may be disposed in the first vertical line VL1.

In this case, the 3D subpixels SP1_3D, SP2_3D, and SP3_3D included in the first pixel UP1 may display a 1-view image.

One edge of each of the 3D subpixels SP1_3D, SP2_3D, and SP3_3D included in the second pixel UP2 may be shifted by the first horizontal distance Hd1 with respect to the first vertical line VL1 and may be disposed. In this case, one edge of a division subpixel disposed at one side among the plurality of division subpixels DSP1, DSP2, and DSP3 included in each of the 3D subpixels SP1_3D, SP2_3D, and SP3_3D may be shifted by the first horizontal distance Hd1 with respect to the first vertical line VL1 and may be disposed. For example, in each of the 3D subpixels SP1_3D, SP2_3D, and SP3_3D included in the second pixel UP2, a left edge of a division subpixel disposed at a leftmost side among the plurality of division subpixels DSP1 to DSP3 may be shifted by the first horizontal distance Hd1 with respect to the first vertical line VL1 and may be disposed.

In this case, the 3D subpixels SP1_3D, SP2_3D, and SP3_3D included in the second pixel UP2 may display a 2-view image.

Furthermore, in the second pixel UP2, even when the 3D subpixels SP1_3D, SP2_3D, and SP3_3D are shifted by the first horizontal distance Hd1 with respect to the first vertical line VL1 and are disposed, the 2D subpixels SP1_2D, SP2_2D, and SP3_2D may be disposed in the first vertical line VL1. That is, one edge of each of the 2D subpixels SP1_2D, SP2_2D, and SP3_2D included in the second pixel UP2 may be disposed in the first vertical line VL1. For example, a left edge of each of the 3D subpixels SP1_3D, SP2_3D, and SP3_3D included in the second pixel UP2 may be disposed in the first vertical line VL1.

Moreover, one edge of each of a plurality of lenses 210 disposed to overlap the 3D subpixels SP1_3D, SP2_3D, and SP3_3D of the first pixel UP1 and a plurality of lenses 210 disposed to overlap the 3D subpixels SP1_3D, SP2_3D, and SP3_3D of the second pixel UP2 may be disposed in the first vertical line VL1.

One edge of each of the 2D subpixels SP1_2D, SP2_2D, and SP3_2D included in the third pixel UP3 may be disposed in the second vertical line VL2. For example, a left edge of each of the 2D subpixels SP1_2D, SP2_2D, and SP3_2D included in the third pixel UP3 may be disposed in the second vertical line VL2.

One edge of each of the 3D subpixels SP1_3D, SP2_3D, and SP3_3D included in the third pixel UP3 may be shifted by the second horizontal distance Hd2 with respect to the second vertical line VL2 and may be disposed. In this case, one edge of a division subpixel disposed at one side among the plurality of division subpixels DSP1, DSP2, and DSP3 included in each of the 3D subpixels SP1_3D, SP2_3D, and SP3_3D may be shifted by the second horizontal distance Hd2 with respect to the second vertical line VL2 and may be disposed. For example, in each of the 3D subpixels SP1_3D, SP2_3D, and SP3_3D included in the third pixel UP3, a left edge of a division subpixel disposed at a leftmost side among the plurality of division subpixels DSP1, DSP2, and DSP3 may be shifted by the second horizontal distance Hd2 with respect to the second vertical line VL2 and may be disposed. Here, the second horizontal distance Hd2 may be greater than the first horizontal distance Hd1.

In this case, the 3D subpixels SP1_3D, SP2_3D, and SP3_3D included in the third pixel UP3 may display a 3-view image.

One edge of each of the 3D subpixels SP1_3D, SP2_3D, and SP3_3D included in the fourth pixel UP4 may be shifted by a fourth horizontal distance Hd4 with respect to the second vertical line VL2 and may be disposed. In this case, one edge of a division subpixel disposed at one side among the plurality of division subpixels DSP1, DSP2, and DSP3 included in each of the 3D subpixels SP1_3D, SP2_3D, and SP3_3D may be shifted by the fourth horizontal distance Hd4 with respect to the second vertical line VL2 and may be disposed. For example, in each of the 3D subpixels SP1_3D, SP2_3D, and SP3_3D included in the fourth pixel UP4, a left edge of a division subpixel disposed at a leftmost side among the plurality of division subpixels DSP1, DSP2, and DSP3 may be shifted by the fourth horizontal distance Hd4 with respect to the second vertical line VL2 and may be disposed. Here, the fourth horizontal distance Hd4 may be greater than the third horizontal distance Hd3.

In this case, the 3D subpixels SP1_3D, SP2_3D, and SP3_3D included in the fourth pixel UP4 may display a 3-view image.

Furthermore, in the fourth pixel UP4, even when the 3D subpixels SP1_3D, SP2_3D, and SP3_3D are shifted by the fourth horizontal distance Hd4 with respect to the second vertical line VL2 and are disposed, the 2D subpixels SP1_2D, SP2_2D, and SP3_2D may be disposed in the second vertical line VL2. That is, one edge of each of the 2D subpixels SP1_2D, SP2_2D, and SP3_2D included in the fourth pixel UP4 may be disposed in the second vertical line VL2. For example, a left edge of each of the 3D subpixels SP1_3D, SP2_3D, and SP3_3D included in the fourth pixel UP4 may be disposed in the second vertical line VL2.

Moreover, one edge of each of a plurality of lenses 210 disposed to overlap the 3D subpixels SP1_3D, SP2_3D, and SP3_3D of the first pixel UP1 and a plurality of lenses 210 disposed to overlap the 3D subpixels SP1_3D, SP2_3D, and SP3_3D of the second pixel UP2 may be disposed in the first vertical line VL1.

Moreover, one edge of each of a plurality of lenses 210 disposed to overlap the 3D subpixels SP1_3D, SP2_3D, and SP3_3D of the third pixel UP3 and a plurality of lenses 210 disposed to overlap the 3D subpixels SP1_3D, SP2_3D, and SP3_3D of the fourth pixel UP4 may be disposed in the second vertical line VL2.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stereopsis image display apparatus, comprising:
a substrate including a display area and a non-display area;
a plurality of pixels in the display area, the plurality of pixels each including a plurality of subpixels; and
a plurality of lenses on the plurality of pixels, each of the plurality of subpixels includes a two-dimensional (2D) subpixel and a three-dimensional (3D) subpixel, and each of the plurality of lenses overlaps at least a portion of the 3D subpixel,
wherein each of the plurality of lenses only overlaps the 3d subpixel.

2. The stereopsis image display apparatus of claim 1, wherein the plurality of lenses are spaced apart from one another by a non-emission area.

3. The stereopsis image display apparatus of claim 1, wherein the 3D subpixel includes a plurality of division subpixels.

4. The stereopsis image display apparatus of claim 1, further comprising a barrier layer between a plurality of light emitting devices in each of the plurality of subpixels and the plurality of lenses, the barrier layer comprises a first opening area in an area overlapping the 2D subpixel and a second opening area in an area overlapping the 3D subpixel.

5. The stereopsis image display apparatus of claim 4, wherein the 3D subpixel includes a plurality of division subpixels, and
the second opening area respectively corresponds to the plurality of division subpixels.

6. The stereopsis image display apparatus of claim 1, wherein each of the plurality of subpixels comprises:
a first electrode;
an emission layer on the first electrode; and
a second electrode on the emission layer, and
the first electrode includes a first sub electrode included in the 2D subpixel and a second sub electrode included in the 3D subpixel.

7. The stereopsis image display apparatus of claim 6, comprising an insulation pattern layer between the second sub electrode and the emission layer, the 3D subpixel includes a plurality of division subpixels, and the insulation pattern layer is between the plurality of division subpixels.

8. The stereopsis image display apparatus of claim 1, wherein;
the plurality of pixels include a first pixel and a second pixel adjacent to the first pixel in a first direction; and
a 3D subpixel included in the second pixel is shifted by a first horizontal distance with respect to a 3D subpixel included in the first pixel.

9. A device, comprising:
a substrate;
a first subpixel on the substrate, the first subpixel including:
a first electrode on the substrate;
a second subpixel on the substrate, the second subpixel including:
a second electrode on the substrate;
a first insulation layer on the first electrode and on the second electrode, the first insulation layer including a plurality of first insulation portions spaced from each other on the second electrode;
a bank on the first insulation layer, on the first electrode, and on the second electrode; and
a lens overlapping the plurality of first insulation portions,
wherein the first insulation layer is overlapping ends of the first electrode and is overlapping ends of the second electrode, and the bank is overlapping ends of the first electrode and ends of the second electrode.

10. The device of claim 9, comprising:

a first emission layer in the first subpixel;

a second emission layer in the second subpixel; and a third electrode that is on the first emission layer and on the second emission layer.

11. The device of claim 9, comprising a second insulation layer on the first subpixel and on the second subpixel, the second insulation layer including a plurality of second insulation portions spaced from each other in the second subpixel, each one of the plurality of first insulation portions is aligned with a respective one of the plurality of second insulation portions.

12. The device of claim 9, wherein the plurality of first insulation portions include a first portion and a second portion that are both on the first electrode, the first portion and the second portion being between a first edge and a second edge of the bank.

13. The device of claim 12, comprising a second insulation layer on the first electrode, the second insulation layer including a third portion and a fourth portion that are between a third edge and a fourth edge of the second insulation layer, the first edge being aligned with the third edge in a first direction and the second edge being aligned with the fourth edge in the first direction.

14. The device of claim 13, wherein the first portion is aligned with the third portion in the first direction and the second portion is aligned with the fourth portion in the first direction.

15. The device of claim 14, wherein the lens extends from the first edge to the second edge in a second direction that is transverse to the first direction.

16. A device, comprising:

a substrate;

a first electrode on the substrate;

a second electrode on the substrate;

a first insulation layer on the first and second electrodes, the first insulation layer including a first opening that exposes the first electrode and a second opening that exposes the second electrode, a plurality of first portions of the first insulation layer being in the second opening on the second electrode; and a lens that overlaps the second opening and does not overlap the first opening.

17. The device of claim 16, comprising a first emission layer in the first opening and a second emission layer in the second opening.

18. The device of claim 17, comprising a third electrode that is on the first emission layer and on the second emission layer and the third electrode is between the lens and the plurality of first portions of the first insulation layer.

19. The device of claim 18, comprising a second insulation layer on the third electrode and between the third electrode and the lens, the second insulation layer includes a plurality of second portions of the second insulation layer.

* * * * *